(12) United States Patent
Yang

(10) Patent No.: US 8,248,085 B2
(45) Date of Patent: Aug. 21, 2012

(54) MOTION SENSOR

(75) Inventor: Song-Ling Yang, Shenzhen (CN)

(73) Assignees: Hong Fu Jin Precision Industry (ShenZhen) Co., Ltd., Shenzhen City, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 242 days.

(21) Appl. No.: 12/684,124

(22) Filed: Jan. 8, 2010

(65) Prior Publication Data

US 2011/0050254 A1    Mar. 3, 2011

(30) Foreign Application Priority Data

Aug. 28, 2009    (CN) .......................... 2009 1 0306267

(51) Int. Cl.
*G01R 27/26* (2006.01)
(52) U.S. Cl. ..................................... 324/661; 73/514.15
(58) Field of Classification Search .................. 324/661, 324/662, 658; 73/514.16, 514.15
See application file for complete search history.

(56) References Cited

U.S. PATENT DOCUMENTS

2002/0179983 A1* 12/2002 Hartwell et al. ............... 257/415
2006/0053888 A1*  3/2006 Sugimori et al. .......... 73/514.16

FOREIGN PATENT DOCUMENTS

CN    1479858 A    3/2004
JP    2005-17075 A    1/2005

* cited by examiner

*Primary Examiner* — Vincent Q Nguyen
(74) *Attorney, Agent, or Firm* — Altis Law Group, Inc.

(57) ABSTRACT

A motion sensor includes a base, a first capacitance electrode, and a second capacitance electrode. The first capacitance electrode is received within the base and includes first capacitance electrode sheets. The second capacitance electrode is received within the base and aligned with the first capacitance electrode to form a capacitance, and includes second capacitance electrode sheets facing and being aligned with the middle group of the first capacitance electrode sheets. The capacitance is changed when the second capacitance electrode sheets stray from the corresponding first capacitance electrode sheets.

19 Claims, 4 Drawing Sheets

MOTION SENSOR

BACKGROUND

1. Technical Field

The present disclosure relates to a motion sensor applied in portable electric devices.

2. Description of the Related Art

At present, motion sensors are widely applied in various electronic devices. For example, motion sensors can be applied in digital cameras for image stabilization. In detail, the motion sensor measures vibration of the digital camera, which can, in turn, provide a corresponding compensation value to the image sensor to enhance image quality. However, conventional motion sensors are often of complicated structure and high cost.

Therefore, it is desirable to provide a motion sensor which can overcome the described limitations.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present motion sensor. Moreover, in the drawings, like reference numerals designate corresponding parts throughout the views.

DETAILED DESCRIPTION

Embodiments of the present motion sensor are described in detail here with reference to the drawings.

Figure 1:
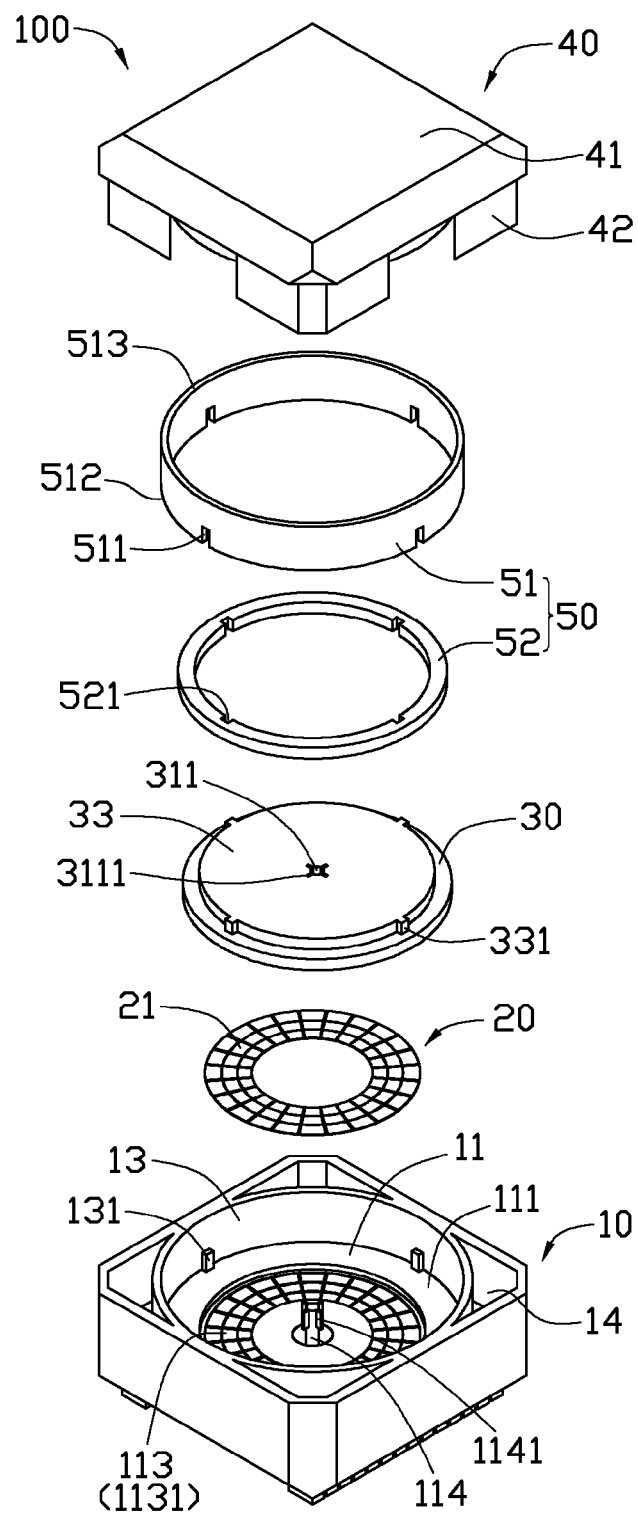
FIG. 1 is an isometric, exploded, schematic view of a motion sensor, according to an exemplary embodiment.
Figure 2:
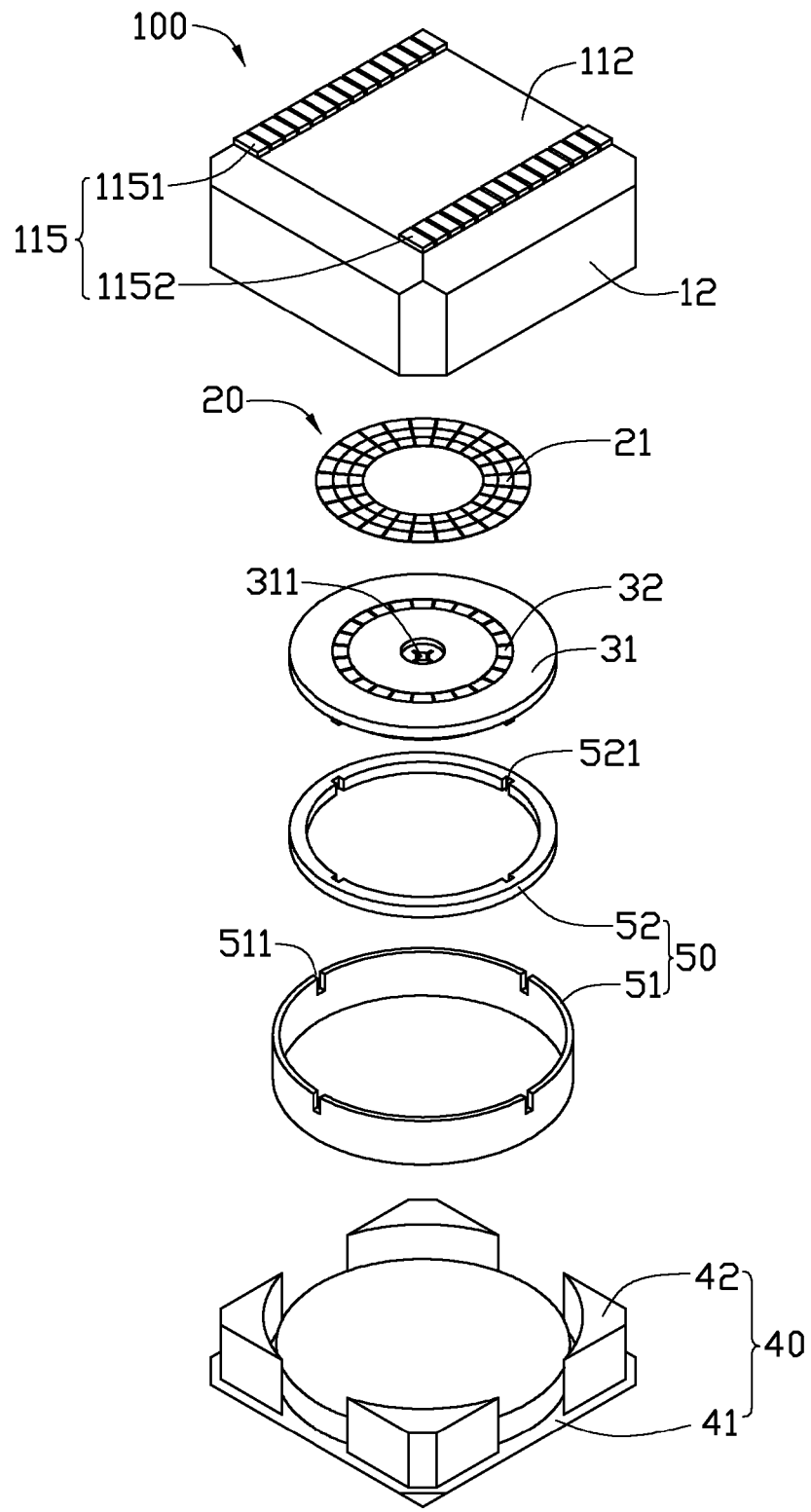
FIG. 2 is similar to FIG. 1, but viewed from another perspective.
Figure 4:
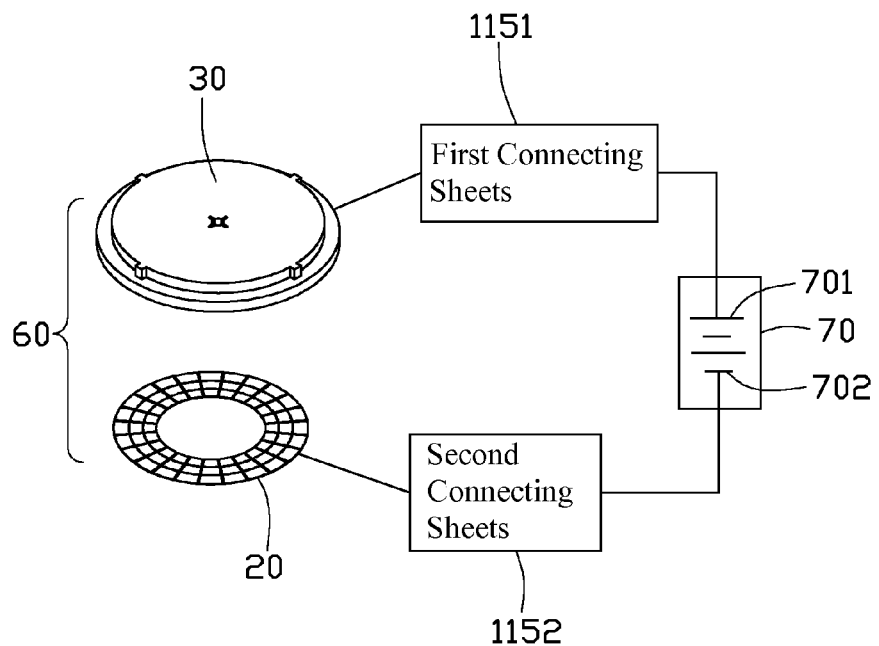
FIG. 4 is a schematic view showing a capacitor being formed between a first capacitance electrode and a second capacitance electrode of the motion sensor of FIG. 1.

Referring to FIGS. 1, 2, and 4, a motion sensor 100, according to an exemplary embodiment, includes a base 10, a first capacitance electrode 20, a second capacitance electrode 30, and a cover 40. The base 10 is barrel-shaped and includes a rectangular bottom sheet 11. The cover 40 covers the top of the base 10. Both the first capacitance electrode 20 and the second capacitance electrode 30 are received within the base 10, and are aligned with and parallel to each other to form a capacitor 60. The cover 40 and the base 10 form a closed chamber for mechanically protecting the first capacitance electrode 20 and the second capacitance electrodes 30 received therein.

In addition to the rectangular bottom sheet 11, the base 10 further includes a rectangular outer sidewall 12, and a circular inner sidewall 13. The rectangular outer sidewall 12 extends upward from four edges of the rectangular bottom sheet 11. The circular inner sidewall 13 also extends upward from the rectangular bottom sheet 11 and internally contacts the rectangular outer sidewall 12. As such, four troughs 14 are defined between the circular inner sidewall 13 and four corners of the rectangular outer sidewall 12. A plurality of first protruding portions 131 protrude from the inner surface of the circular inner sidewall 12 generally at the corner of intersection of the inner surface thereof and the rectangular bottom sheet 11. The rectangular bottom sheet 11 includes an inner side 111 and an outer side 112 opposite to the inner side 111. The inner side 111 and the circular inner sidewall 13 cooperatively define a receiving portion 113. The rectangular bottom sheet 11 defines a number of sector-receiving portions 1131.

In this embodiment, the sector-receiving portions 1131 are pie-slice-shaped. Three groups of the sector-receiving portions 1131 are employed. Each group of the sector-receiving portions 1131 is of the same inner radius of curvature and outer radius of curvature and is annularly arranged. One of the three groups of the sector-receiving portions 1131 is adjacently interposed between the other two groups of the sector-receiving portions 1131. It should be noted that the structure of the sector-receiving portions 1131 is not limited to that described but can vary with requirements.

The base 10 further includes an elastic shaft 114 extending upward from the center of the receiving portion 113. The top end of the elastic shaft 114 is configured for connecting the second capacitance electrode 30 and therefore forms a number of location sheets 1141 configured for locating the second capacitance electrode 30. In this embodiment, two crossed location sheets 1141 radially extend away from the top end of the elastic shaft 114.

The outer side 112 forms a number of connecting sheets 115 electrically connected to the first capacitance electrode 20 and the second capacitance electrode 30. For example, the connecting sheets 115 can include a number of first connecting sheets 1151 electrically coupled to the first capacitance electrodes 20, and a number of second connecting sheets 1152 electrically coupled to the second capacitance electrodes 30. The first connecting sheets 1151 are aligned with an edge of the outer side 112. The second connecting sheets 1152 are aligned with another edge of the outer side 112, parallel to the line of the first connecting sheets 1151.

The first capacitance electrode 20 includes first capacitance electrode sheets 21. In this embodiment, corresponding to the sector-receiving portions 1131, three groups of first capacitance electrode sheets 21 are employed. All first capacitance electrode sheets 21 are pie-slice-shaped and can fittingly fill the corresponding sector-receiving portions 1131. After all the first capacitance electrode sheets 21 are accommodated in the sector-receiving portions 1131, the first capacitance electrode sheets 21 can be coupled to a first electrode 701 of an external power source 70 through the first connecting sheets 1151.

The second capacitance electrode 30 includes an immobile plate 31, and a number of second capacitance electrode sheets 32. The second capacitance electrode sheets 32 are all pie-slice-shaped and are attached to one surface of the disk. The second capacitance electrode sheets 32 are of the same inner radius of curvature and outer radius of curvature and are annularly arranged corresponding to the middle group of the first capacitance electrode sheets 21. The immobile plate 31 defines a cross through hole 311 generally at the center thereof and fixes to the top of the elastic shaft 114 via the engagement of the location sheet 1141 and the cross through hole 311. Upon assembly, the second capacitance electrode sheets 32 face and align with the middle group of the first capacitance electrode sheets 21. The second capacitance electrode sheets 32 are connected to the second connecting sheet 1152 via connection means through the immobile plate 31 and the elastic shaft 114. As such, the second capacitance electrode sheets 32 can be coupled to a second electrode 702 of the external power source 70 via the second connecting sheets 1152. The immobile plate 31 includes a protruding platform 33 opposite to the second capacitance electrode sheets 32. The protruding platform 33 includes a plurality of protruding portions 331 formed on the outer sidewall of the protruding platform 33.

The motion sensor 100 further includes a magnetic recovery component 50 configured for recovering the second capacitance electrode 30. The magnetic recovery component 50 includes a first ring magnet 51 and a second ring magnet 52 spaced with an inner side of the first ring magnet 51. The first ring magnet 51 includes a first end 512 and a second end 513 opposite to the first edge 512. The first edge 512 defines a plurality of first openings 511 facing and aligned with the corresponding protruding portions 331. The second ring magnet 52 defines a plurality of second openings 512 formed on the inner side thereof. When the first ring magnet 51 is closely sleeved by the circular inner wall 13, the first protruding portions 131 are received in the first openings 511 respectively. When the second ring magnet 52 is fixed to the protruding platform 33, the second protruding portions 331 are received in the second openings 521 respectively. The inner side of the first ring magnet 51 has the same polarity as the outer side of the second ring magnet 52.

The cover 40 includes a rectangular sheet 41 and four insertions 42 corresponding to the four troughs 14 from four corners of the rectangular sheet 41 aligned with the corresponding four troughs 14. When the cover 40 covers the base 10, the inserts 42 respectively are received in the corresponding troughs 14.

Figure 3:
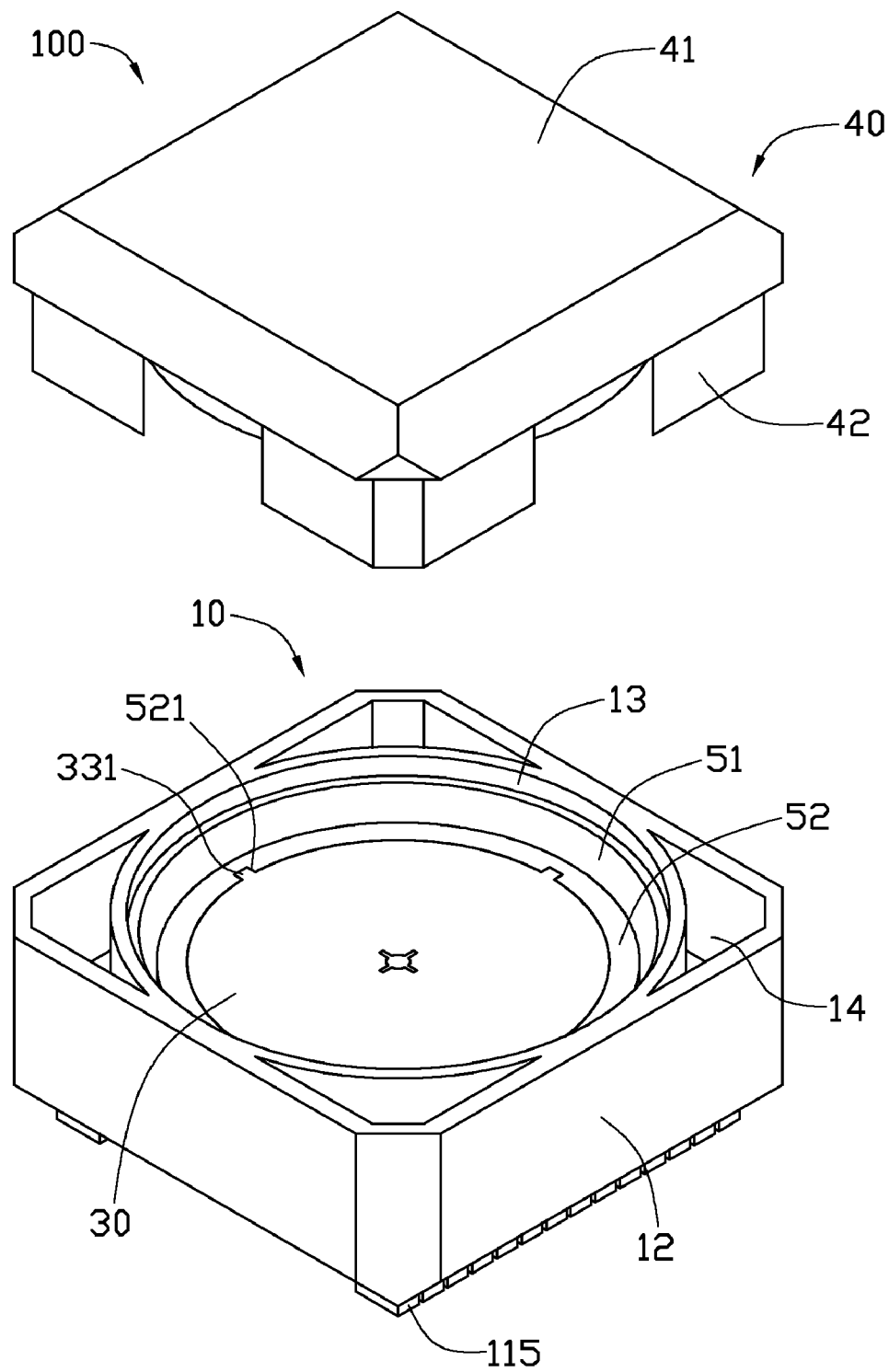
FIG. 3 is an isometric, partially assembled, schematic view of the motion sensor of FIG. 1.

Referring to FIG. 3, upon assembly of the motion sensor 100, the second capacitance electrode sheets 32 face the corresponding first capacitance electrode sheets 21, parallel thereto, to form a plurality of capacitors respectively. In this embodiment, after the first, second electrodes 701, 702 are coupled to the corresponding first, second capacitance electrode sheets 21, 32, the first, second capacitance electrode sheets 21, 32 are fully charged. In particular, a total capacitance C of the capacitor is calculated according to $C=\in S/d$, where $\in$ represents a dielectric constant between the first, second capacitance electrode sheets 21, 32, S represents an area between the first, second capacitance electrode sheets 21, 32, and d represents a distance between the first, second capacitance electrode sheets 21, 32. From this formula, the C is proportional to the S, and inversely proportional to the d. The C, a voltage V between the first, second capacitance electrode sheets 21, 32, and electrical quantities Q have a relation of, $V=Q/C$. That is, the V is inversely proportional to the C, but proportional to the Q.

In operation of the motion sensor 100, when the motion sensor 100 is still, the second capacitance electrode sheets 32 are aligned with the first capacitance electrode sheets 21 so that the C formed between the first, second capacitance electrode sheets 21, 32 remains unchanged. When the motion sensor 100 is subject to vibration, the second capacitance electrode sheets 32 stray from the corresponding first capacitance electrode sheets 21 so that the S is changed. In other words, the C is changed corresponding to the S. The Q is constant, so the V will be changed corresponding to the C and recorded to analyze the vibration degree. The analysis will be provided by an integrated circuit (IC) chip (not shown). When the vibration is over, the second capacitance electrode 30 returns to an original position as a result of repulsion of the first, second ring magnets 51, 52 and an elasticity of the elastic shaft 114. Consequently, the second capacitance electrode sheet 32 is in the face of the first capacitance electrode sheet 21 again.

The present motion sensor 100 can detect vibration and adjust a displacement thereof utilizing the capacitance change. It is simply structured, compact, and easily assembled.

While the disclosure has been described by way of example and in terms of exemplary embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A motion sensor, comprising:
    a base comprising a rectangular bottom sheet, the bottom sheet comprising an inner side and an outer side opposite to the inner side;
    a first capacitance electrode comprising at least one group of first capacitance electrode sheets that is received within the base; and
    a second capacitance electrode comprising at least one group of second capacitance electrode sheets that is received within the base, the first capacitance electrode and the second capacitance electrode sheets being aligned with and parallel to each other to form a capacitance;
    wherein the outer side of the rectangular bottom sheet comprises a plurality of connecting sheets electrically connected to the first capacitance electrode and the second capacitance electrode, the first capacitance electrode sheets and the second capacitance electrode sheets are coupled to an external power source through the connecting sheets;
    when the motion sensor is subject to vibration, the second capacitance electrode sheets stray from the corresponding first capacitance electrode sheets, so that the capacitance is changed accordingly, the vibration is detected by detecting a change of the capacitance.

2. The motion sensor of claim 1, wherein the base further comprises a rectangular outer sidewall, and a circular inner sidewall, the outer sidewall extending upward from four edges of the rectangular bottom sheet perpendicularly and internally contacts the circular inner sidewall, the circular inner sidewall and the four corners of the rectangular outer sidewall defining four troughs.

3. The motion sensor of claim 2, wherein the inner side and the circular inner sidewall of the rectangular bottom sheet cooperatively defining a receiving portion.

4. The motion sensor of claim 3, wherein the rectangular bottom sheet defines a number of sector-receiving portions, each being of the same inner radius of curvature and outer radius of curvature and being pie-slice-shaped.

5. The motion sensor of claim 3, the base further comprising an elastic shaft extending upward from the center of the inner side of the rectangular bottom sheet.

6. The motion sensor of claim 5, wherein the top end of the elastic shaft is configured for connecting the second capacitance electrode and forms a number of location sheets configured for locating the second capacitance electrode.

7. The motion sensor of claim 6, wherein the immobile plate defines a cross through hole generally at the center thereof and is fixed to the top of the elastic shaft via the engagement of the location sheet and the cross through hole.

8. The motion sensor of claim 2, further comprising a cover comprising a rectangular sheet and four insertions corresponding to the four troughs from four corners of the rectangular sheet aligned with the corresponding four troughs.

9. The motion sensor of claim 1, the second capacitance electrode further comprises an immobile plate corresponding to the second capacitance electrode sheets, the second capacitance electrode sheets being all pie-slice-shaped and attached to one surface of the immobile plate, the second capacitance electrode sheets comprising the same inner radius of curvature and outer radius of curvature as those of the group of the first capacitance electrode sheets which the second capacitance electrode sheets are aligned with, and annularly arranged corresponding to the group of the first capacitance electrode sheets.

10. The motion sensor of claim 9, wherein the immobile plate comprises a protruding platform opposite to the second capacitance electrode sheets, the protruding platform comprising a plurality of protruding portions formed on the rectangular outer sidewall of the protruding platform.

11. The motion sensor of claim 1, further comprising a magnetic recovery component configured for recovering the second capacitance electrode, wherein the magnetic recovery component comprises a first ring magnet and a second ring magnet, the first ring magnet is fixed to the base, and the second ring magnet is fixed to the second capacitance electrode, the inner side of the first ring magnet has the same polarity as the outer side of the second ring magnet, when the vibration has ceased, the second capacitance electrode returns to an original position due to a repulsion between the first ring magnet and the second ring magnet.

12. A motion sensor, comprising:
a base;
a first capacitance electrode received within the base and comprising first capacitance electrode sheets arranged in three groups with one group disposed in the middle of the other two;
a second capacitance electrode comprising second capacitance electrode sheets received within the base, the second capacitance electrode sheets facing and being aligned with the middle group of the first capacitance electrode sheets to form a capacitance;
a cover comprising a rectangular sheet and four insertions corresponding to four corners of the rectangular sheet; and
a magnetic recovery component configured for recovering the second capacitance electrode, wherein the magnetic recovery component comprises a first ring magnet and a second ring magnet spaced with an inner side of the first ring magnet, the first ring magnet is fixed to the base, and the second magnet is fixed to the second capacitance electrode, the inner side of the first ring magnet has the same polarity as the outer side of the second ring magnet;
wherein when the motion sensor is subject to vibration, the second capacitance electrode sheets stray from the middle group of first capacitance electrode sheets, so that the capacitance is changed accordingly, the vibration is detected by detecting a change of the capacitance; and when the vibration has ceased, the second capacitance electrode returns to an original position due to a repulsion between the first ring magnet and the second ring magnet.

13. The motion sensor of claim 12, wherein the base comprises a rectangular bottom sheet, a rectangular outer sidewall, and a circular inner sidewall, the outer sidewall extending upward from four edges of the rectangular bottom sheet and internally contacting the circular inner sidewall, the circular inner sidewall and the four corners of the rectangular outer sidewall defining four troughs.

14. The motion sensor of claim 13, wherein the rectangular bottom sheet comprises an inner side and an outer side opposite to the inner side, the inner side and the circular inner sidewall cooperatively define a receiving portion.

15. The motion sensor of claim 14, wherein the outer side of the rectangular bottom sheet forms a number of connecting sheets electrically connected to the first capacitance electrode and the second capacitance electrode.

16. The motion sensor of claim 13, wherein the rectangular bottom sheet defines a number of sector-receiving portions, each group of the sector-receiving portions comprising the same inner radius of curvature and outer radius of curvature and being pie-slice-shaped.

17. The motion sensor of claim 16, the base further comprising an elastic shaft extending upward from the center of the inner side of the rectangular bottom sheet.

18. The motion sensor of claim 17, wherein the top end of the elastic shaft is configured for connecting the second capacitance electrode and forms a number of location sheets configured for locating the second capacitance electrode.

19. The motion sensor of claim 12, the second capacitance electrode further comprises an immobile plate corresponding to the second capacitance electrode sheets, the second capacitance electrode sheets being all pie-slice-shaped and attached to one surface of the immobile plate, the second capacitance electrode sheets comprising the same inner radius of curvature and outer radius of curvature as those of the middle group of the first capacitance electrode sheets, and annularly arranged corresponding to the middle group of the first capacitance electrode sheets, the immobile plate defines a cross through hole generally at the center thereof and is fixed to the top of the elastic shaft via the engagement of the location sheet and the cross through hole, the immobile plate comprises a protruding platform opposite to the second capacitance electrode sheets, the protruding platform comprising a plurality of protruding portions formed on the rectangular outer sidewall of the protruding platform.

* * * * *